United States Patent
Lee et al.

(10) Patent No.: US 9,083,360 B2
(45) Date of Patent: Jul. 14, 2015

(54) LOCK DETECTER AND CLOCK GENERATOR HAVING THE SAME

(71) Applicant: Electronics and Telecommunications Research Institute, Daejeon (KR)

(72) Inventors: Hui Dong Lee, Daejeon (KR); Kwang Chun Lee, Daejeon (KR); Jae Ho Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/036,736

(22) Filed: Sep. 25, 2013

(65) Prior Publication Data

US 2014/0085016 A1    Mar. 27, 2014

(30) Foreign Application Priority Data

Sep. 25, 2012  (KR) .................... 10-2012-0106240

(51) Int. Cl.
*H03L 7/085* (2006.01)
*H03L 7/095* (2006.01)

(52) U.S. Cl.
CPC ...................... *H03L 7/095* (2013.01)

(58) Field of Classification Search
CPC ...................................... H03L 7/095
USPC ...... 331/1 A, 17, 16, 34, DIG. 2; 327/157, 48
See application file for complete search history.

(56) References Cited

U.S. PATENT DOCUMENTS

| | | | |
|---|---|---|---|
| 5,530,383 A | 6/1996 | May | |
| 6,744,838 B1 | 6/2004 | Dixit | |
| 7,268,629 B2 * | 9/2007 | Takase | 331/1 A |
| 7,969,249 B2 * | 6/2011 | Jeon | 331/17 |
| 2002/0171296 A1 * | 11/2002 | Ishibashi | 307/100 |

FOREIGN PATENT DOCUMENTS

EP          0550360 A1 *  7/1993

* cited by examiner

*Primary Examiner* — Arnold Kinkead
(74) *Attorney, Agent, or Firm* — Nelson Mullins Riley & Scarborough LLP

(57) ABSTRACT

A lock detector and a clock generator including the same are disclosed. A lock detector includes a counter unit which counts a non-matching section of a first signal and a second signal to provide a count value, the first signal and the second signal being comparison result signals obtained by comparing a phase of a reference signal with a phase of a comparison signal, and a lock detection unit which outputs a lock detection signal based on a result of comparing the count value with the reference value. Accordingly, a lock state of the phase-locked loop can be detected rapidly and exactly.

11 Claims, 14 Drawing Sheets

FIG. 2
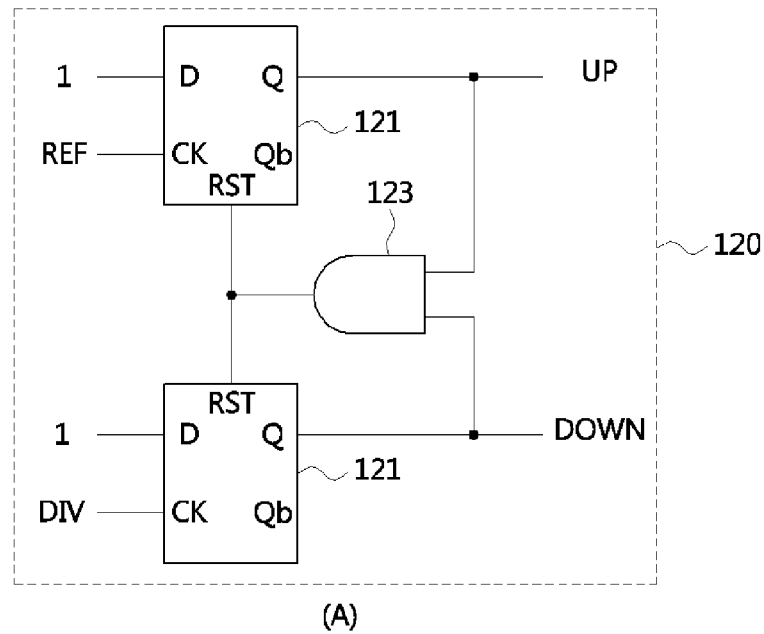
(A)
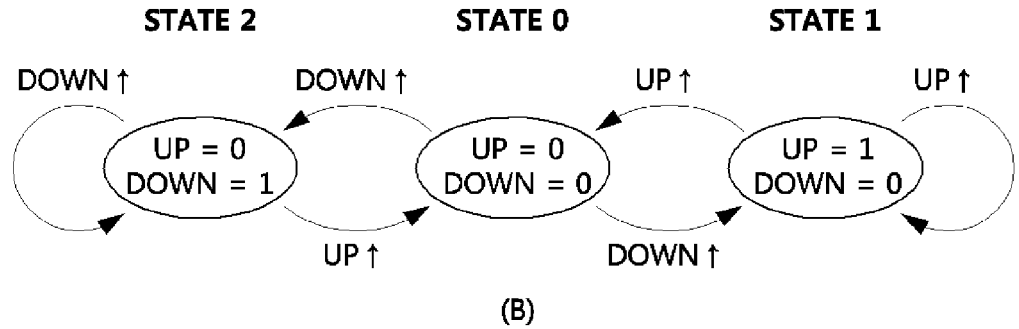
(B)
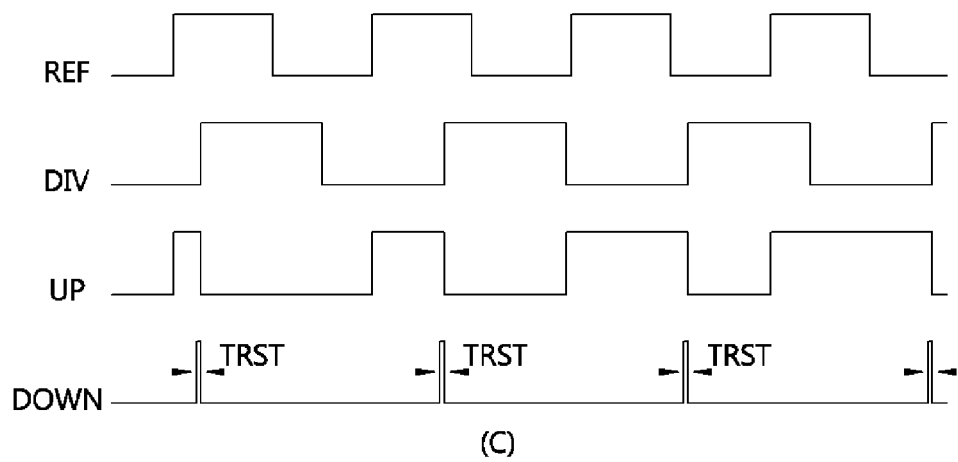
(C)

FIG. 7
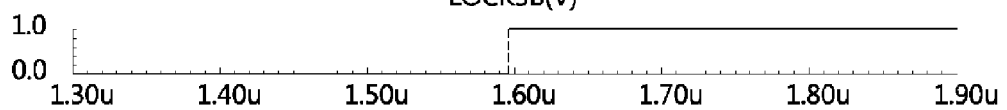
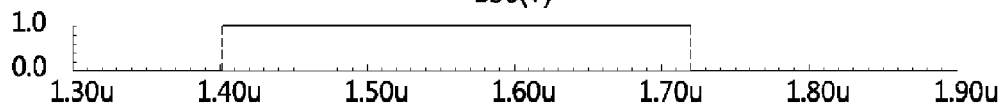
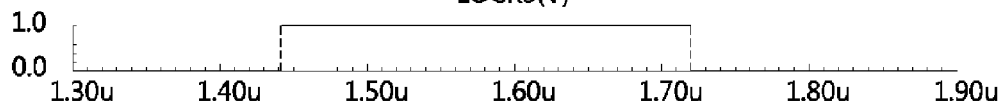
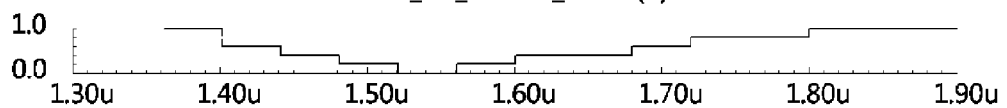
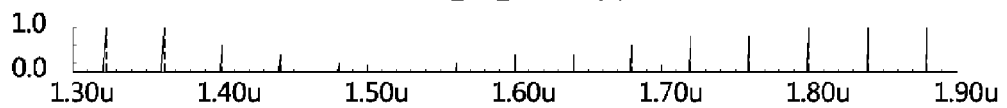
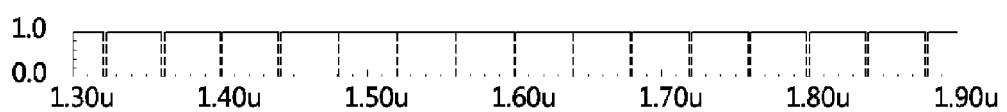
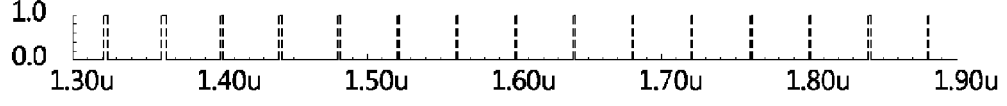
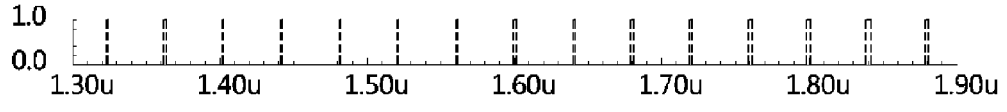
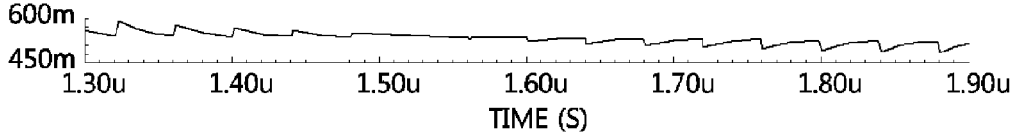
TIME (S)

FIG. 10
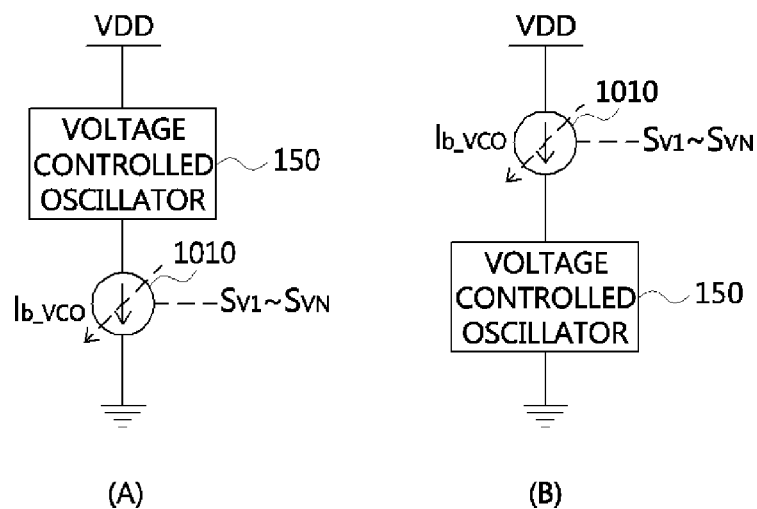
(A)  (B)
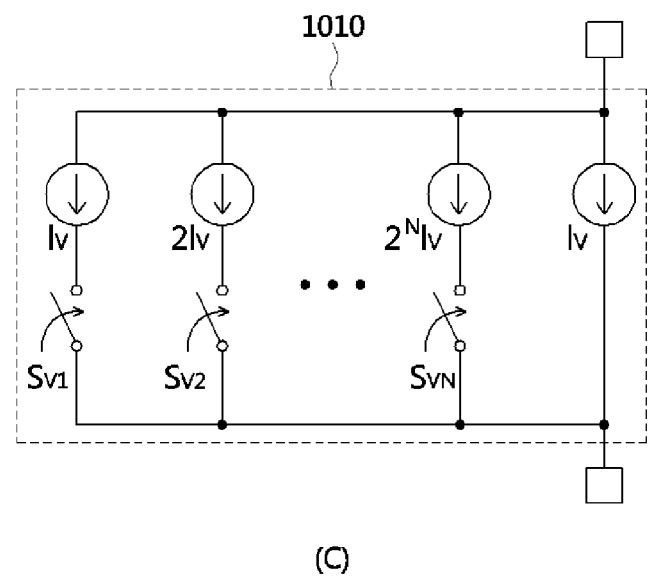
(C)

FIG. 11
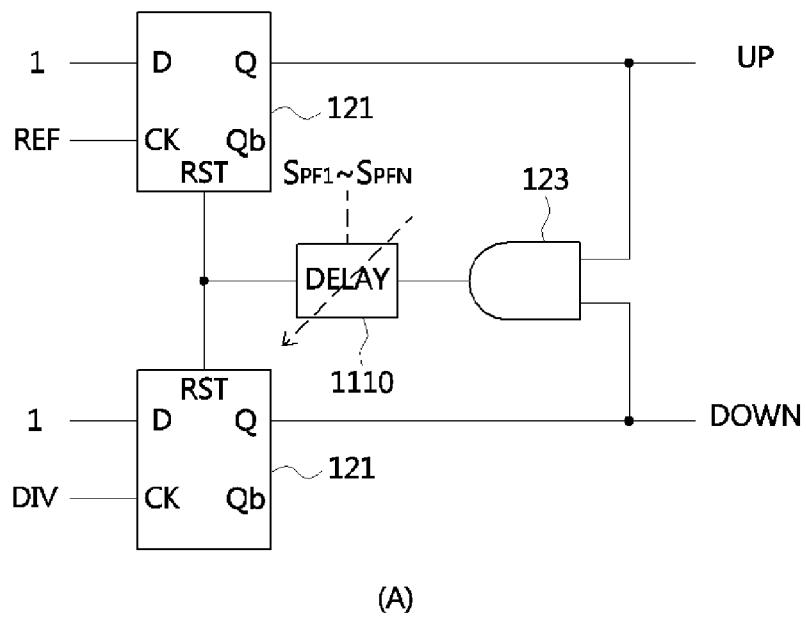
(A)
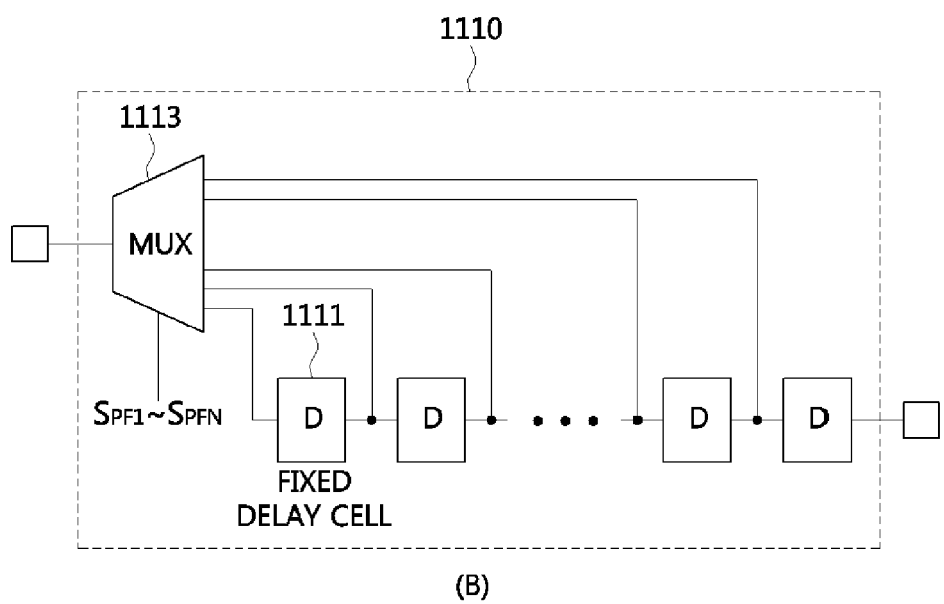
(B)

FIG. 12
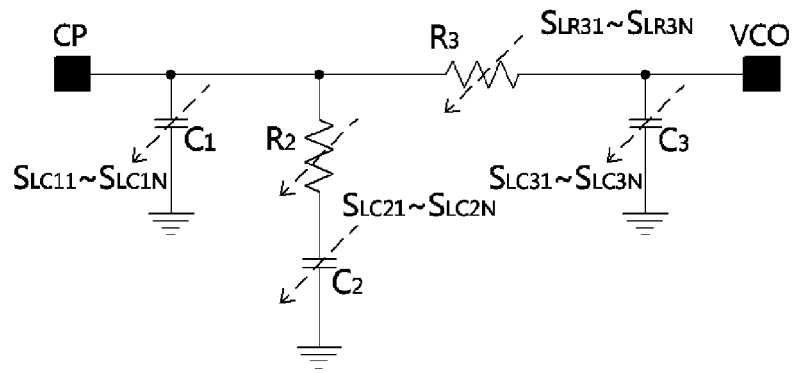
(A)
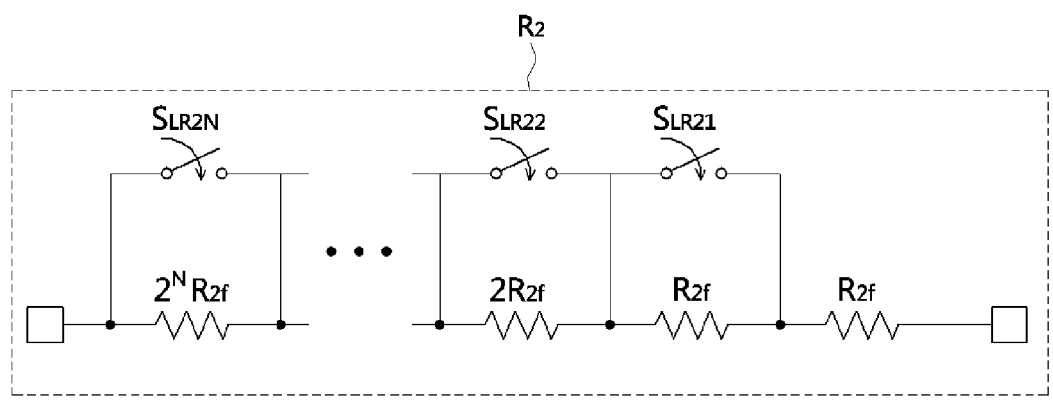
(B)
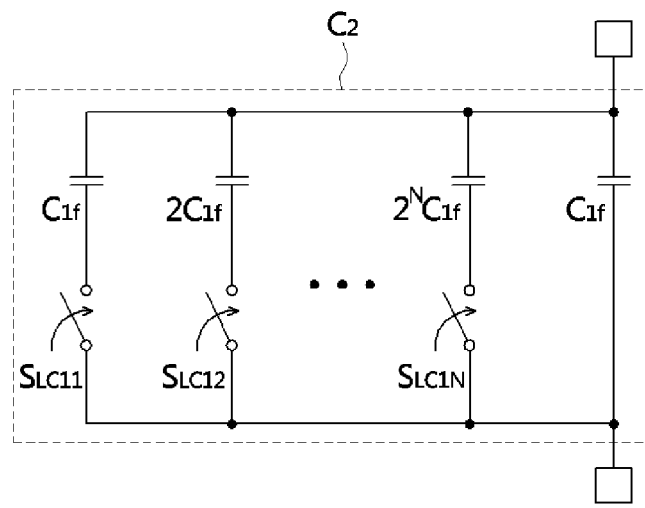
(C)

FIG. 13
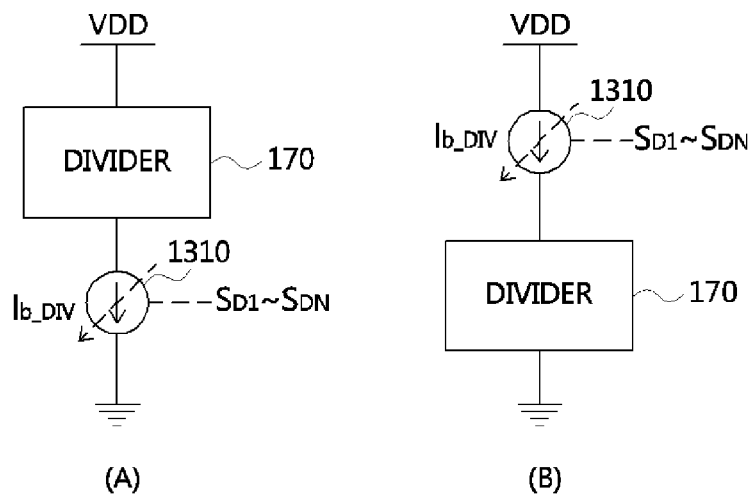
(A)  (B)
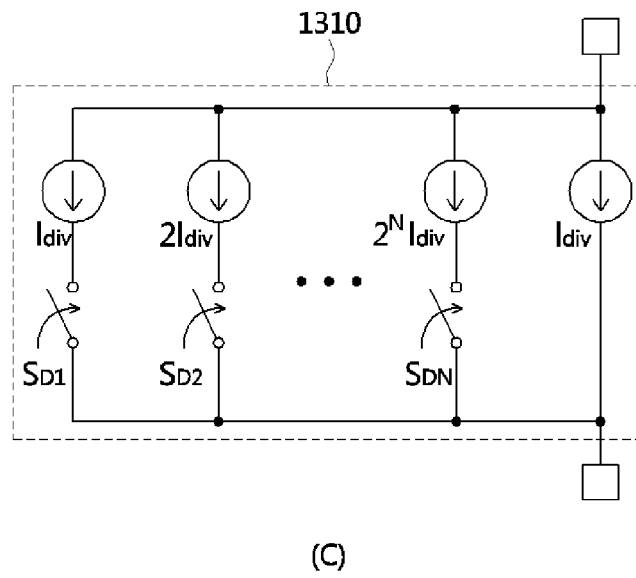
(C)

LOCK DETECTER AND CLOCK GENERATOR HAVING THE SAME

CLAIM FOR PRIORITY

This application claims priority to Korean Patent Application No. 10-2012-0106240 filed on Sep. 25, 2012 in the Korean Intellectual Property Office KIPO, the entire contents of which are hereby incorporated by reference.

BACKGROUND

1. Technical Field

Example embodiments of the present invention relate to phase lock detection technology, and more specifically, to a lock detector capable of rapidly determining whether phase lock is made and a clock generator including the same.

2. Related Art

A phase-locked loop (PLL) circuit is a circuit which continuously compares a phase of a reference clock with a phase of an output clock and corrects a frequency based on a result thereof such that the output clock always maintains a constant frequency, and is one of basic circuits generally included in an electronic system.

Generally, the phase-locked loop circuit includes a lock detection circuit which determines whether a phase of an output clock and a phase of a reference clock match. Here, a lock state refers to a state in which the phase of the output clock and the phase of the reference clock match, and circuits operating based on the output clock of the phase-locked loop circuit use an output of the phase-locked loop circuit in a lock state.

However, a lock detection circuit included in a conventional phase-locked loop circuit divides a clock signal output from a voltage controlled oscillator (VCO) into a clock signal at a low frequency and then performs lock detection based on the divided clock signal. Accordingly, a lock detection speed is low.

Further, the conventional lock detection circuit cannot exactly detect the lock state of the phase-locked loop circuit since the conventional lock detection circuit does not consider a property of parameters of respective components of the phase-locked loop circuit varying with a process, a voltage, and a temperature (PVT), or the like.

SUMMARY

Accordingly, example embodiments of the present invention are provided to substantially obviate one or more problems due to limitations and disadvantages of the related art.

Example embodiments of the present invention provide a lock detector capable of detecting a lock state quickly and exactly.

Example embodiments of the present invention also provide a clock generator including the lock detector.

In some example embodiments, a lock detector includes a counter unit which counts a non-matching section of a first signal and a second signal to provide a count value, the first signal and the second signal being comparison result signals obtained by comparing a phase of a reference signal with a phase of a comparison signal; and a lock detection unit which outputs a lock detection signal based on a result of comparing the count value with a reference value.

Here, the counter unit may include a first gate which determines the non-matching section of the first signal and the second signal and outputs the determination result signal as a determination result; and a first counter which counts a clock signal when the determination result signal of the first gate indicates the non-matching state. Further, the counter unit may include a first delay unit which delays the determination result signal to output a delayed clock; and a first register that stores the count value in response to the delayed clock.

Here, the counter unit may be connected to a phase-locked loop and may count the non-matching section of the first signal and the second signal using a clock signal output from a voltage controlled oscillator of the phase-locked loop.

The lock detection unit may include a comparator which compares the count value with the reference value to output the comparison result signal; a second delay unit which includes a plurality of delay elements connected in series and outputs a delayed signal obtained by each delay element delaying a signal by a time set in advance; a second counter which counts a width of a first level indicating that the count value is smaller than the reference value using the reference signal to provide a width count value when the comparison result signal is the first level; and a second gate which outputs a last lock detection signal based on a delayed signal corresponding to the width count value among a plurality of delayed signals output from the second delay unit and the comparison result signal. Further, the lock detection unit may further include a third delay unit which delays the comparison result signal to output a delayed comparison result signal; and a second register which stores the width count value based on the delayed comparison result signal. Further, the lock detection unit may further include a second gate which outputs a first lock detection signal based on the comparison result signal and a delayed signal having a shortest delay time among the plurality of delayed signals output from the second delay unit.

Here, the reference value may be provided from the outside of the lock detector, and a size and a duration of the reference value may be adjustable.

Here, the lock detector may provide a compensation signal for compensating for an operational property of a circuit to which the lock detector is connected.

In other example embodiments, a clock generator includes a phase-locked loop circuit which compares a comparison signal obtained by dividing a generated clock signal with a reference signal, and adjusts a frequency of the clock signal based on a comparison result to fix the clock signal to a frequency set in advance; and a lock detector which is connected to the phase-locked loop circuit, counts a non-matching section of a first signal and a second signal to generate a count value, the first signal and the second signal being comparison result signals obtained by comparing a phase of the reference signal with a phase of the comparison signal, and then outputs a lock detection signal based on a result of comparing the count value with a reference value.

Here, the phase-locked loop circuit may include a charge pump which generates a current signal corresponding to a result of comparing the comparison signal with the reference signal, and the lock detector may provide the charge pump with a compensation signal for compensating for a current property of the charge pump. Further, the phase-locked loop circuit may include a voltage controlled oscillator that generates the clock signal, and the lock detector may count the non-matching section of the first signal and the second signal using the clock signal.

Effects of the Invention

According to the lock detector and the clock generator including the same as described above, the lock detector can rapidly detect the lock since the lock detector detects the lock using the output signal of the voltage controlled oscillator or the signal obtained by dividing the output signal of the voltage controlled oscillator by a small value.

Further, it is possible to exactly detect the lock state because lock detection precision can be adjusted through an external signal. It is also possible to easily determine a non-matching state of the phase-locked loop circuit through an external signal and to compensate for the non-matching state.

Since the lock detector according to example embodiments of the present invention has a simple configuration, it is easy to implement the lock detector. Accordingly, the lock detector can be easily applied to all electronic circuits such as a frequency synthesizer, as well as the phase-locked loop circuit.

BRIEF DESCRIPTION OF DRAWINGS

Example embodiments of the present invention will become more apparent by describing in detail example embodiments of the present invention with reference to the accompanying drawings, in which:

FIG. 2 illustrates a configuration and operation of a phase frequency comparator illustrated in FIG. 1;

FIG. 7 illustrates an enlarged section of a part of the timing diagram illustrated in FIG. 6;

FIG. 10 illustrates a compensation circuit of a voltage controlled oscillator according to an example embodiment of the present invention;

FIG. 11 illustrates a compensation circuit of a phase frequency comparator according to an example embodiment of the present invention;

FIG. 12 illustrates a loop filter compensation circuit according to an example embodiment of the present invention; and FIG. 13 illustrates a divider compensation circuit according to an example embodiment of the present invention.

DESCRIPTION OF EXAMPLE EMBODIMENTS

Figure 1:
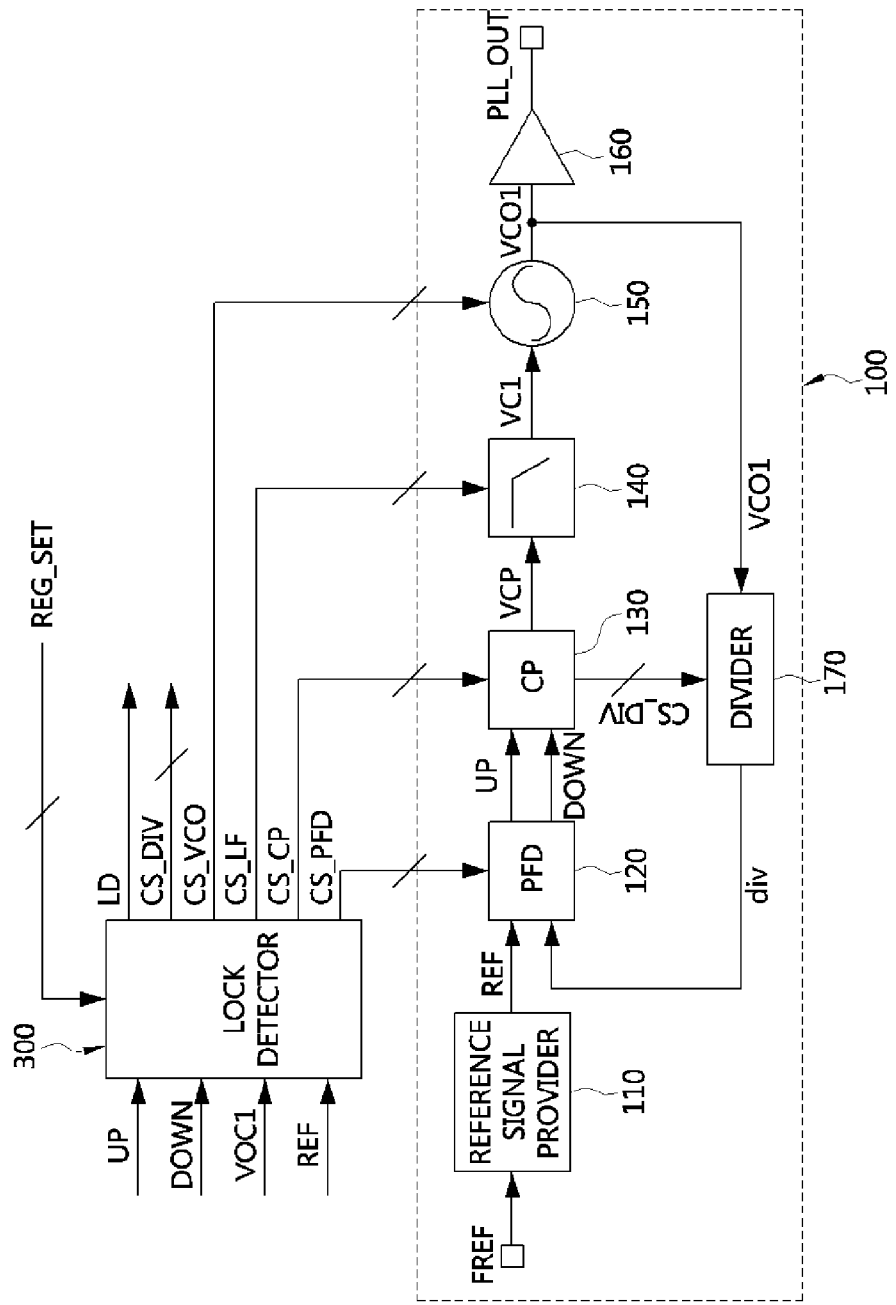
FIG. 1 is a block diagram illustrating a configuration of a clock generator according to an example embodiment of the present invention.

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising, ", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a configuration of a clock generator according to an example embodiment of the present invention.

Referring to FIG. 1, the clock generator includes a phase-locked loop circuit 100, and a lock detector 300 which is connected to the phase-locked loop circuit 100 and detects a lock state of the phase-locked loop.

First, a configuration and operation of the phase-locked loop circuit 100 will be described.

The phase-locked loop circuit 100 may include a reference signal provider 110, a phase frequency comparator 120, a charge pump 130, a loop filter 140, a voltage controlled oscillator 150, a buffer 160 and a divider 170.

The reference signal provider 110 may include a divider and/or a multiplier, and divides or multiplies an oscillation clock signal Fref generated by an external oscillation circuit (not shown) and supplies a reference signal ref to the phase frequency comparator 120. For example, when an output signal (PLL_OUT) frequency of the clock generator is 2.4 GHz or 5 GHz and the oscillation clock signal Fref is 10 MHz to 40 MHz, the reference signal provider 110 may divide or multiply the oscillation clock signal Fref and provide the reference signal ref of about 1 MHz to 80 MHz.

The phase frequency comparator (PFD: Phase Frequency Detector) 120 may include a phase comparator (not shown), and compares a phase of the reference signal ref provided from the reference signal provider 110 with a phase of a comparison signal div provided from the divider 170, and outputs a comparison result signal (up and down) based on a comparison result. For example, when the phase of the reference signal ref leads the phase of the comparison signal div, the phase frequency comparator 120 provides a comparison result signal (up=1) corresponding to a phase difference between the two signals to the charge pump 130. Or, when the phase of the reference signal ref lags behind the phase of the comparison signal div, the phase frequency comparator 120 may provide a comparison result signal (down=1) corresponding to the phase difference between the two signals to the charge pump 130.

The charge pump (CP) 130 provides the loop filter 140 with a current signal vcp having a level corresponding to the comparison result signal provided from the phase frequency comparator 120.

The loop filter (LF) 140 removes a high-frequency component from the current signal vcp provided from the charge pump 130, converts the current signal vcp into a voltage signal to generate a control voltage vc1, and supplies the generated control voltage vc1 to the voltage controlled oscillator 150.

The voltage controlled oscillator (VCO) 150 generates a clock signal vco1 having an oscillation frequency corresponding to the control voltage vc1 provided from the loop filter 140. For example, when the control voltage vc1 corresponding to the phase difference signal is provided from the loop filter 140, the voltage controlled oscillator 150 may increase the oscillation frequency to advance the phase of the clock signal vco1 or decrease the oscillation frequency to delay the phase of the clock signal vco1 according to the provided control voltage vc1.

The voltage controlled oscillator 150, for example, may be configured to output the clock signal vco1 having a frequency of about 2.4 GHz or 5 GHz.

The clock signal vco1 output from the voltage controlled oscillator 150 may be used as a system clock signal PLL_OUT of other circuits in another device or the same device via the buffer 160. Further, the clock signal vco1 output from the voltage controlled oscillator 150 is provided to the divider 170.

The divider 170 divides the clock signal vco1 output from the voltage controlled oscillator 150 at a division ratio set in advance to generate the comparison signal div, and provides the comparison signal div to the phase frequency comparator 120. Here, a division value N in the divider 170 may be set according to the oscillation frequency required as the output of the voltage controlled oscillator 150.

The lock detector 300 is connected to the phase-locked loop circuit 100, rapidly detects the lock state of the phase-locked loop and outputs a lock detection signal LD indicating the detected state.

The lock detector 300 monitors the comparison result signals up and down, which are the outputs of the phase frequency comparator 120, counts a section in which the up signal and the down signal do not match using the clock signal vco1, determines that the phase-locked loop is locked when the count value is smaller than a comparison reference value, and activates a lock detection signal LD. Here, the lock detector 300 can rapidly detect the lock state of the phase-locked loop by using the clock signal vco1 which is the output of the voltage controlled oscillator 150 as a clock signal for counting the section in which the up signal and the down signal do not match or as a clock signal for counting an N-divided signal. For example, when the output of the voltage controlled oscillator 150 is 2.4 GHz or 5 GHz, N may be set to 2 to 8.

The lock detector 300 can also provide compensation signals CS_PFD, CS_CP, CS_LF, CS_VCO, and CS_DIV for compensating for operational properties of the phase frequency comparator 120, the charge pump 130, the loop filter 140, the voltage controlled oscillator 150, and the divider 170 of the phase-locked loop circuit 100 to such corresponding components.

Further, the lock detector 300 can adjust lock state detection precision based on a setting signal REG_SET provided from the outside and can confirm whether each component of the phase-locked loop circuit 100 abnormally works.

A configuration and operation of the lock detector will be described in greater detail with reference to FIGS. 3A to 9.

FIG. 2 illustrates a configuration and operation of the phase frequency comparator illustrated in FIG. 1. FIG. 2(a) illustrates a circuit configuration of the phase frequency comparator 120 for 3 phases, FIG. 2(b) illustrates an operation state of the phase frequency comparator 120, and FIG. 2(c) is a timing diagram illustrating an operation of the phase frequency comparator 120.

Referring to FIG. 2(a), the phase frequency comparator 120 may include two D-flip flops 121 and one AND gate 123, and outputs the comparison result signals up and down according to the reference signal ref and the comparison signal div, which are input signals. Here, activation of the up signal among the comparison result signals means that the phase of the reference signal ref leads the phase of the comparison signal div, and activation of the down signal means that the phase of the reference signal ref lags behind the phase of the comparison signal div.

Hereinafter, for convenience of explanation, an active state of an output of a logical circuit is indicated by logic "high" or "1," and an inactive state is indicated by logic "low" or "0."

The phase frequency comparator 120 having the structure illustrated in FIG. 2(a) is an edge-triggered sequential circuit. Since the phase frequency comparator 120 operates according to a rising edge (or a positive transition) of the reference signal ref and the comparison signal div, the phase frequency comparator 120 operates regardless of a duty cycle of an input signal.

The phase frequency comparator 120 has three logic states: State 0, State 1 and State 2 according to the operation, as illustrated in FIG. 2(b).

In other words, when the phase of the reference signal ref leads the phase of the comparison signal div, the state is moved to "State 0" or "State 1" according to a previous state, as illustrated in FIG. 2(c). On the other hand, when the phase of the reference signal ref lags behind the phase of the comparison signal div, the state is moved to "State 0" or "State 2" according to a previous state. Further, when the reference signal ref and the comparison signal div are locked, the state remains as "State 0."

Meanwhile, referring to the down signal of FIG. 2(c), there is a case in which the up signal and the down signal are both 1 (a section Trst), which is a state not illustrated in FIG. 2(b). When the up signal and the down signal, which are the comparison output signals of the phase frequency comparator 120, are both 1, the two D-flip flops 121 should be immediately reset through the AND gate 123, but there is another state (i.e., up=1 and down=1) due to a delay time of the logical circuit.

Further, even when the phase-locked loop circuit 100 is locked, there is a case in which the up signal and the down signal are both 1. In this case, a case in which the up signal and the down signal are 1 at the same time during the section Trst every period of the reference signal ref or the comparison signal div occurs.

The lock detector 300 according to an example embodiment of the present invention uses the up signal and the down signal, which are the comparison detection signals output from the phase frequency comparator 120, as input signals, to detect the lock state.

The example in which the phase frequency comparator 120 includes the two D-flip flops 121 and the one AND gate 123 has been illustrated in FIG. 2, but the configuration of the phase frequency comparator 120 is not limited to content illustrated in FIG. 2 and may be implemented in various forms.

Meanwhile, the phase-locked loop may be simplified into a second-order feedback system.

In this case, a response time $t_s$ of the phase-locked loop may be approximated by a damping ratio $\psi$ and a national frequency $\omega n$ as shown in Expression 1.

$$t_s \approx 4/(\psi \cdot \omega n) \quad \text{[Expression 1]}$$

The national frequency $\omega n$ or the damping ratio $\psi$ should be increased in order to reduce the response time $t_s$ of the phase-locked loop, as shown in Expression 1.

However, in order to reduce the response time, the damping ratio $\psi$ should be increased since the national frequency $\omega n$ is determined by a loop bandwidth of a system. The damping ratios $\psi$ of the phase-locked loop should be at least $1/\sqrt{2}$ or more in order to rapidly determine the lock. Further, the damping ratio $\psi$ should be high in consideration of stability of the phase-locked loop, and is generally set to $1/\sqrt{2}$.

In an example embodiment of the present invention, the damping ratio of the phase-locked loop circuit 100 is set to $1/\sqrt{2}$ or more so that phase-locked loop circuit 100 can stably operate and the lock state can be detected quickly and exactly. Here, the damping ratio $\psi$ may be determined based on a gain of the voltage controlled oscillator 150, an amount of current of the charge pump 130, a value of the loop filter 140 or the like.

Figure 3A:
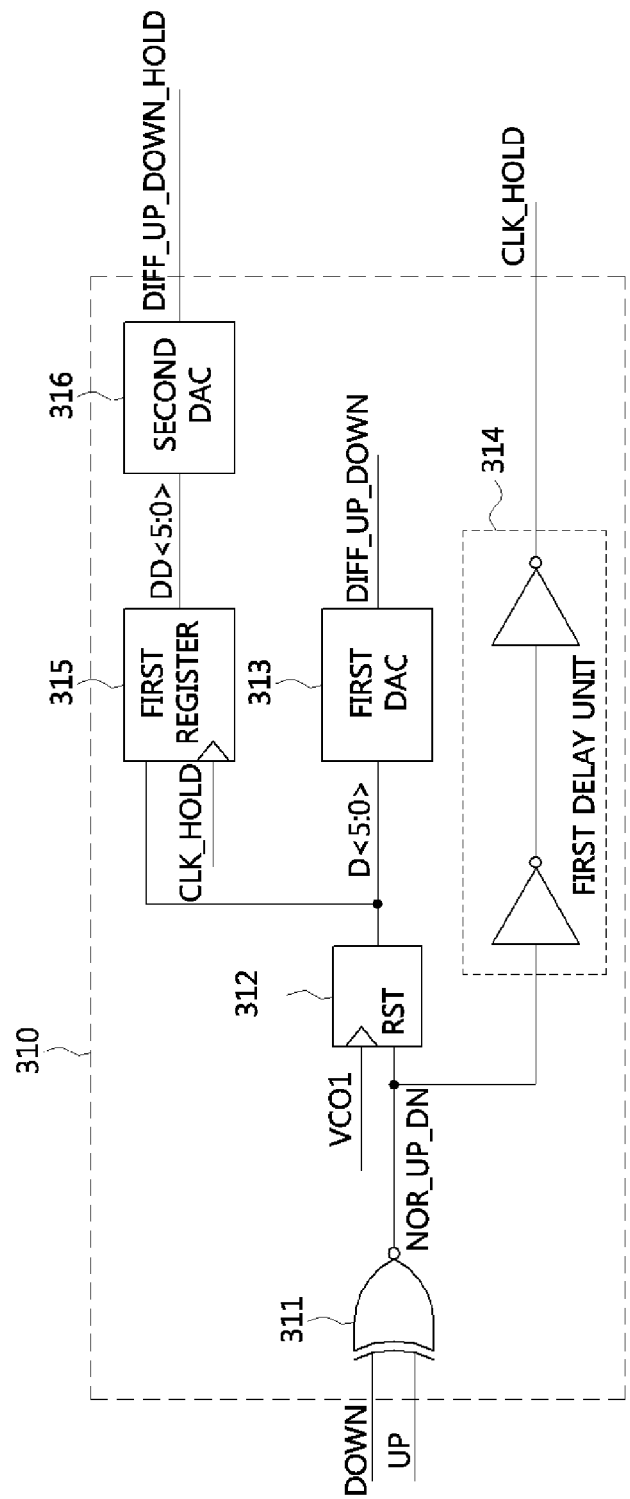
FIGS. 3A and 3B illustrate a configuration and operation of a counter unit in the configuration of the lock detector according to an example embodiment of the present invention.
Figure 3B:
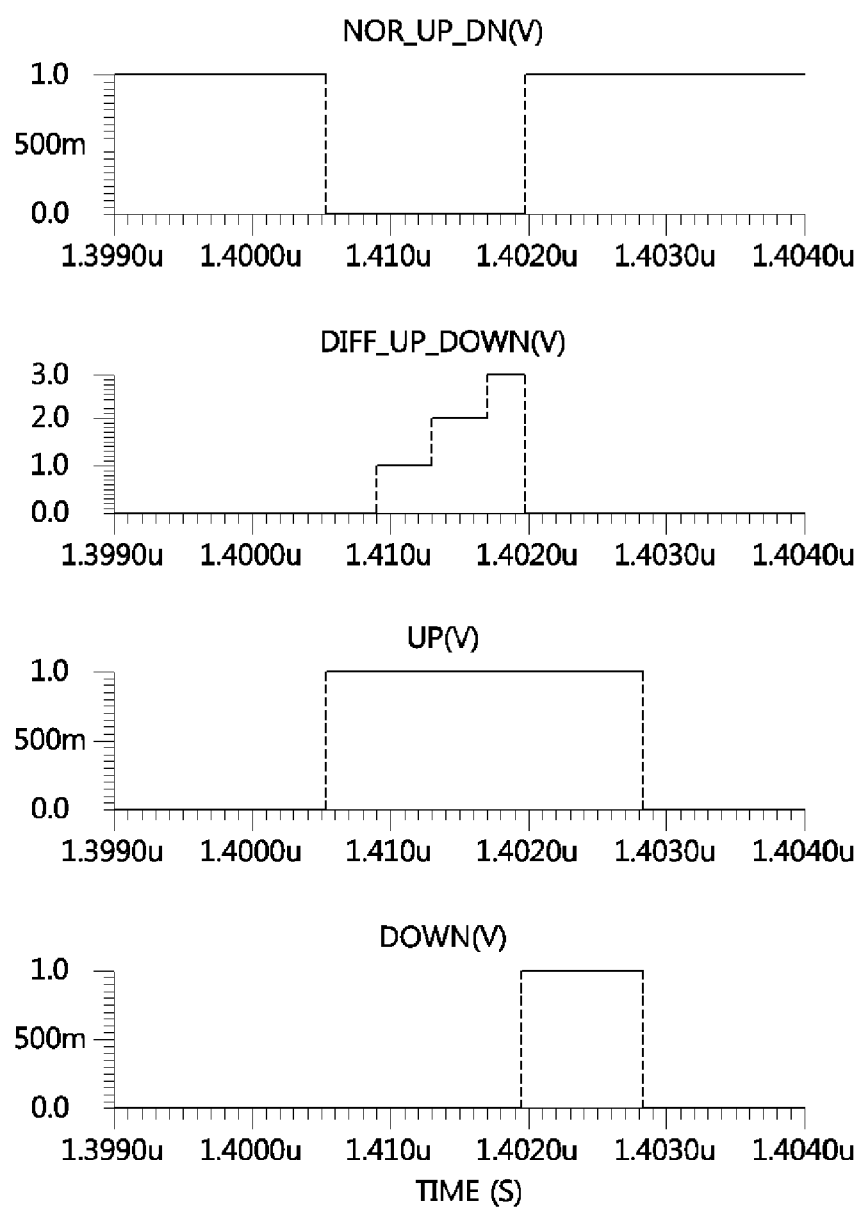

FIGS. 3A and 3B illustrate a configuration and operation of a counter unit in the configuration of the lock detector according to an example embodiment of the present invention.

FIG. 3A illustrates a configuration of the counter unit 310 which counts the non-matching section of the up signal and the down signal, which are the comparison result signals output from the phase frequency comparator 120. FIG. 3B is a timing diagram illustrating an operation of the counter unit 310 illustrated in FIG. 3A. Here, the non-matching section means a section in which voltage levels of the up signal and the down signal do not match. For example, the section in which the voltage level of the up signal is "high" and the voltage level of the down signal is "low" is the non-matching section, as illustrated in FIG. 3B.

Referring to FIGS. 3A and 3B, the counter unit 310 may include an EX-NOR gate 311, a first counter 312, a first DAC 313, a first delay unit 314, a first register 315, and a second DAC 316. Here, the first DAC 313 and the second DAC 316 are intended to explain the operation of the counter unit 310 and may not be included in actual implementation of the counter unit 310.

The EX-NOR gate 311 receives the up signal and the down signal provided from the phase frequency comparator 120, performs an exclusive NOR operation on the up and down signals, and then outputs a counter reset signal nor_up_dn as a result thereof. For example, the EX-NOR gate 311 outputs a "high" counter reset signal nor_up_dn if the up signal and the down signal are both "high" or "low," and otherwise, outputs a "low" counter reset signal nor_up_dn, as illustrated in FIG. 3B.

The first counter 312 is reset when the counter reset signal nor_up_dn provided from the EX-NOR gate 311 is "high," and counts the clock signal vco1 provided from the voltage controlled oscillator 150 to output a count value D<5:0> when the counter reset signal nor_up_dn is "low." Here, the example in which the first counter 312 has a 6-bit count value D<5:0> has been illustrated. Further, the first counter 312 may be a normal up-counter or down-counter, or may be an up-down counter. For example, the first counter 312 may be an up-down counter to determine whether the non-matching state of the up signal and the down signal is generated in the up signal or the down signal.

The first DAC 313 converts the count value D<5:0> output from the first counter 312 into a decimal number and outputs a converted count value diff_up_down. The first DAC 313 is illustrated for convenience of explanation and may be excluded in the actual implementation.

The first delay unit 314 delays the counter reset signal nor_up_dn output from the EX-NOR gate 311 to output a delayed clock signal clk_hold.

The first register 315 stores a last count value (or a maximum count value) of the first counter 312 by storing the counter value D<5:0> of the first counter 312 in response to the delayed clock signal clk_hold provided from the first delay unit 314. The last count value which is stored in the first register 315 in this way is DD<5:0>.

The second DAC 316 converts the last count value DD<5:0> stored in the first register 315 into a decimal number and outputs the converted last count value diff_up_down_hold. Here, the second DAC 316 is illustrated for convenience of explanation and may be excluded in the actual implementation.

Referring to FIG. 3B, in a section in which each of the up signal and the down signal of the comparison result signals of the phase frequency comparator 120 is "low," the count reset signal nor_up_dn becomes "high," the first counter 312 is reset and accordingly the count value diff_up_down becomes "0."

Then, when the up signal transitions to "high," the count reset signal nor_up_dn becomes "low," and the first counter 312 starts counting using the clock signal vco1. The counting is continued until the down signal transitions to "high" and the up signal and the down signal become both "high."

When the up signal and the down signal become both "high," the count reset signal nor_up_dn becomes "high," the first counter 312 is reset and accordingly the count value diff_up_down becomes "0." Further, the up signal and the down signal become both "low" in the phase frequency comparator 120, and such a process is repeated.

A maximum or last value among the count values diff_up_down obtained by the first counter 312 performing counting in a section in which the counter reset signal nor_up_dn is "low" is stored in the first register 315 in response to the delayed clock signal clk_hold obtained by delaying the counter reset signal nor_up_dn using the first delay unit 314.

Figure 4:
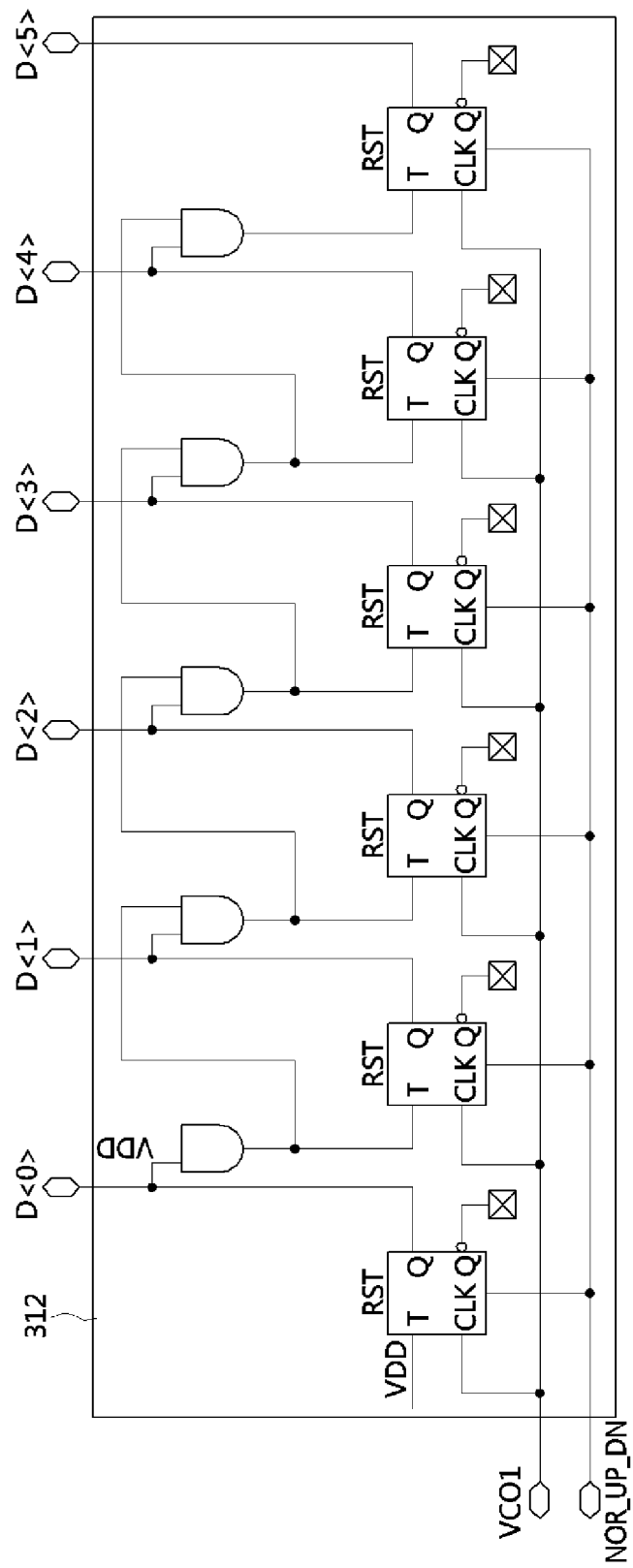
FIG. 4 is a circuit diagram illustrating a configuration example of a first counter illustrated in FIG. 3A.

FIG. 4 is a circuit diagram illustrating a configuration example of the first counter illustrated in FIG. 3A.

In FIG. 4, an example of a 6-bit counter including six T-flip flops and five AND gates is shown, but the configuration of the first counter 312 is not limited to the configuration illustrated in FIG. 4 and the counter may be configured in various forms or may be configured to have various bit sizes.

Since the first counter 312 illustrated in FIG. 4 is a 6-bit counter (D<5:0>), the first counter 312 can count a decimal number from 0 to 63. An output value of the counter increases by 1 (which is a decimal number) at a rising edge of the clock signal vco1.

In other words, the output value is reset to 0 when the counter reset signal nor_up_dn is "high," and the counter value increase by 1 at each rising edge of the clock signal vco1 when the counter reset signal nor_up_dn is "low."

Figure 5:
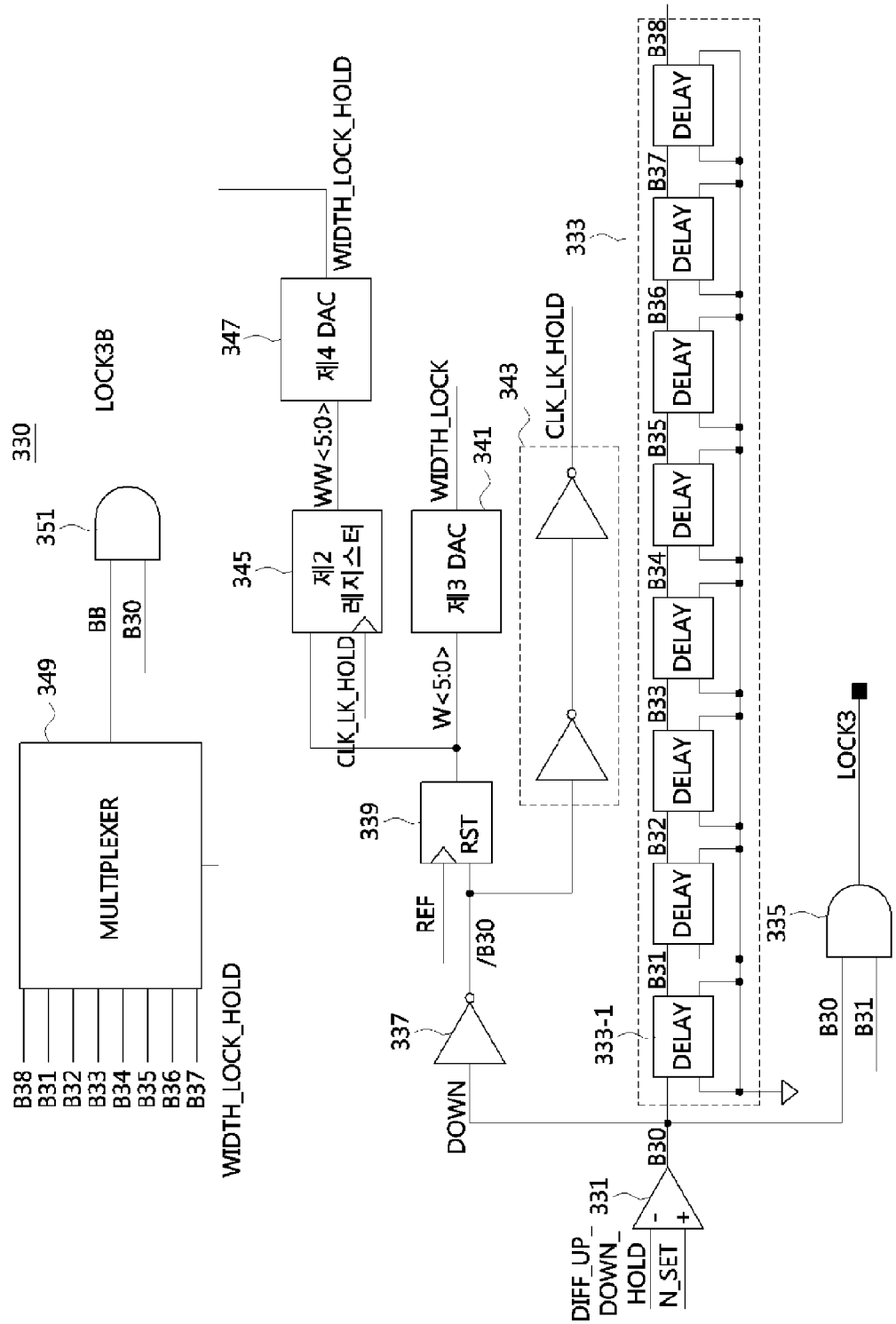
FIG. 5 is a circuit diagram illustrating a configuration of a lock detection unit in the configuration of the lock detector according to an example embodiment of the present invention.

FIG. 5 is a circuit diagram illustrating a configuration of a lock detection unit in the configuration of the lock detector according to an example embodiment of the present invention. The configuration of the lock detection unit 330 that determines whether lock is made based on the last counter value diff_up_down_hold of the counter unit 310 illustrated in FIG. 3A and outputs a lock detection signal which is a result thereof is illustrated.

Figure 6:
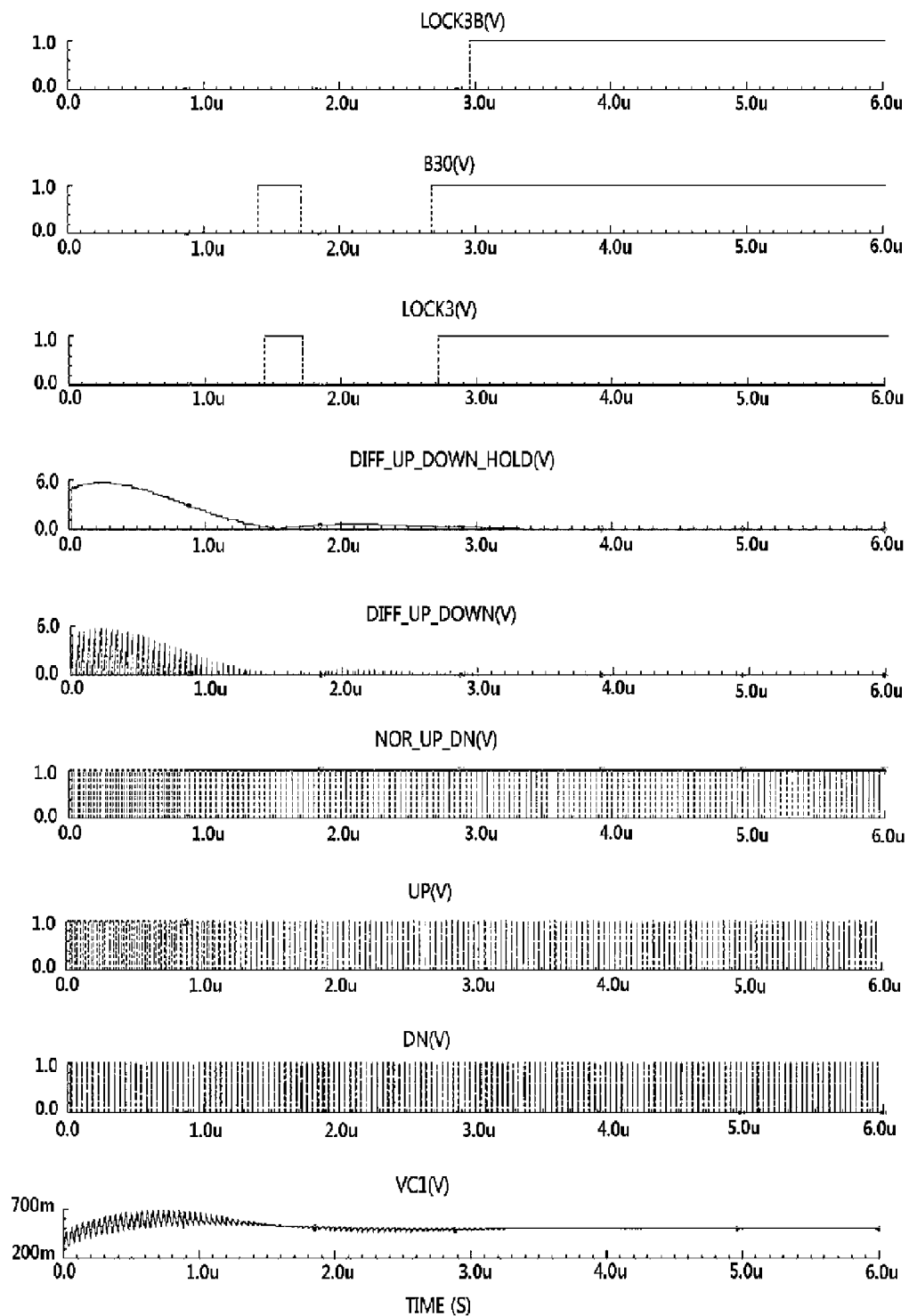
FIG. 6 is a timing diagram illustrating an operation of the lock detector.

Further, FIG. 6 is a timing diagram illustrating an operation of the lock detector, and FIG. 7 illustrates an enlarged section of a part of the timing diagram illustrated in FIG. 6.

Referring to FIGS. 5 to 7, the lock detection unit 330 may include a comparator 331, a second delay unit 333, an AND gate 335, an inverter 337, a second counter 339, a third DAC 341, a third delay unit 343, a second register 345, a fourth DAC 347, a multiplexer 349 and an AND gate 351.

The comparator 331 compares the last count value output from the counter unit 310 diff_up_down_hold with a comparison reference value N_set and outputs a comparison result signal b30 as a result thereof. Here, the last count value diff_up_down_hold is the value stored in the first register 315 of the counter unit 310, and the comparison reference value N_set is a part of the digital setting signal REG_SET provided form the outside of the counter unit 310. Each of the last count value diff_up_down_hold and the comparison reference value N_set may substantially include digital data of a plurality of bits.

The comparator 331 may output "high" if the last count value diff_up_down_hold is smaller than the comparison reference value N_set whose value may be determined from the outside of the lock detector 300, and, otherwise, may output "low".

The second delay unit 333 may include a plurality of delay elements 333-1 connected in series, and delays the comparison result signal b30 output from the comparator 331. Each delay element 333-1 may delay an input signal by a period of the reference signal ref and output a resultant signal. While the example in which the second delay unit 333 includes eight delay elements 333-1 connected in series has been shown in an example embodiment of the present invention, the configuration of the second delay unit 333 is not limited thereto.

The AND gate 335 performs an AND operation of the comparison result signal b30 which is the output of the comparator 331 and an output signal b31 of the first delay element of the second delay unit 333, and outputs, as a result thereof, a simple lock detection signal lock3 as illustrated in FIGS. 6 and 7.

However, a section in which the simple lock detection signal lock3 and the comparison result signal b30 remain "high" may be generated even when locking is not actually completed, as illustrated in FIG. 6.

The lock detector 300 according to an example embodiment of the present invention includes a configuration for counting a width of a section in which the comparison result signal b30 is activated (e.g., a "high" section) using the reference signal ref in order to solve such a problem.

Hereinafter, a configuration for counting the width of the activation section of the comparison result signal b30 and outputting the last lock detection signal based on a count value will be described.

The Inverter 337 inverts the comparison result signal b30, which is the output signal of the comparator 331, and provides a resultant signal to a reset input of the second counter 339. Here, the inverter 337 is used for the purpose of the second counter 339 performing a count operation when the comparison result signal b30, which is the output of the comparator, is "high." Accordingly, when the second counter 339 includes a reset terminal operating in a manner of active low, the inverter 337 can be excluded from the configuration of the lock detection unit 330.

The second counter 339 receives the output signal /b30 of the inverter 337 as a reset signal and receives the reference signal ref as an input signal. When the reset signal is inactivated (e.g., when the output signal of the inverter 337 is "low"), the second counter 339 performs counting using the reference signal ref to output a count value W<5:0>. Here, the count value W<5:0> means a value obtained by counting the width of the section in which the comparison result signal b30 that is the output signal of the comparator 331 is "high."

The third DAC 341 converts the count value W<5:0> output from the second counter 339 into a decimal number to output a converted count value width_lock. The third DAC 341 is illustrated for convenience of explanation and may be excluded in actual implementation.

The third delay unit 343 delays the output/b30 of the inverter 337 to output a delayed clock signal clk_lk_hold. Here, the delayed clock signal clk_lk_hold is input to the second register 345 as a clock signal.

The second register 345 stores a last count value (or a maximum value among the count values) of the second counter 339 according to the delayed clock signal clk_lk_hold output from the third delay unit 343. The last count value stored in the second register 345 is WW<5:0>.

The fourth DAC 347 converts the last count value WW<5:0> stored in the second register 345 into a decimal number to output a converted last count value width_lock_hold. Here, the fourth DAC 347 is illustrated for convenience of explanation and may be excluded in actual implementation.

The multiplexer 349 receives, as inputs, output signals b30, b31, b32, b33, b34, b35, b36, b37, and b38 of the respective delay elements included in the second delay unit 333 and outputs any one of the input signals based on the last count value width_lock_hold provided from the fourth DAC 347.

The AND gate 351 performs an AND operation of an output signal bb of the multiplexer 349 and the comparison result signal b30 output from the comparator 331, and outputs a last lock detection signal lock3b as a result thereof.

The last lock detection signal lock3b may be used as the lock detection signal LD of the lock detector 300 illustrated in FIG. 1.

However, the simple lock detection signal lock3 may be used as the lock detection signal LD, as will be described below. Further, precision of the lock state detection may be adjusted using the simple lock detection signal lock3.

Specifically, the simple lock detection signal lock3 may be a correct lock detection signal or may be an incorrect lock detection signal according to how to set the comparison reference value N_set, which is the input signal of the comparator 331 illustrated in FIG. 5, and/or a duration thereof.

Figure 8:
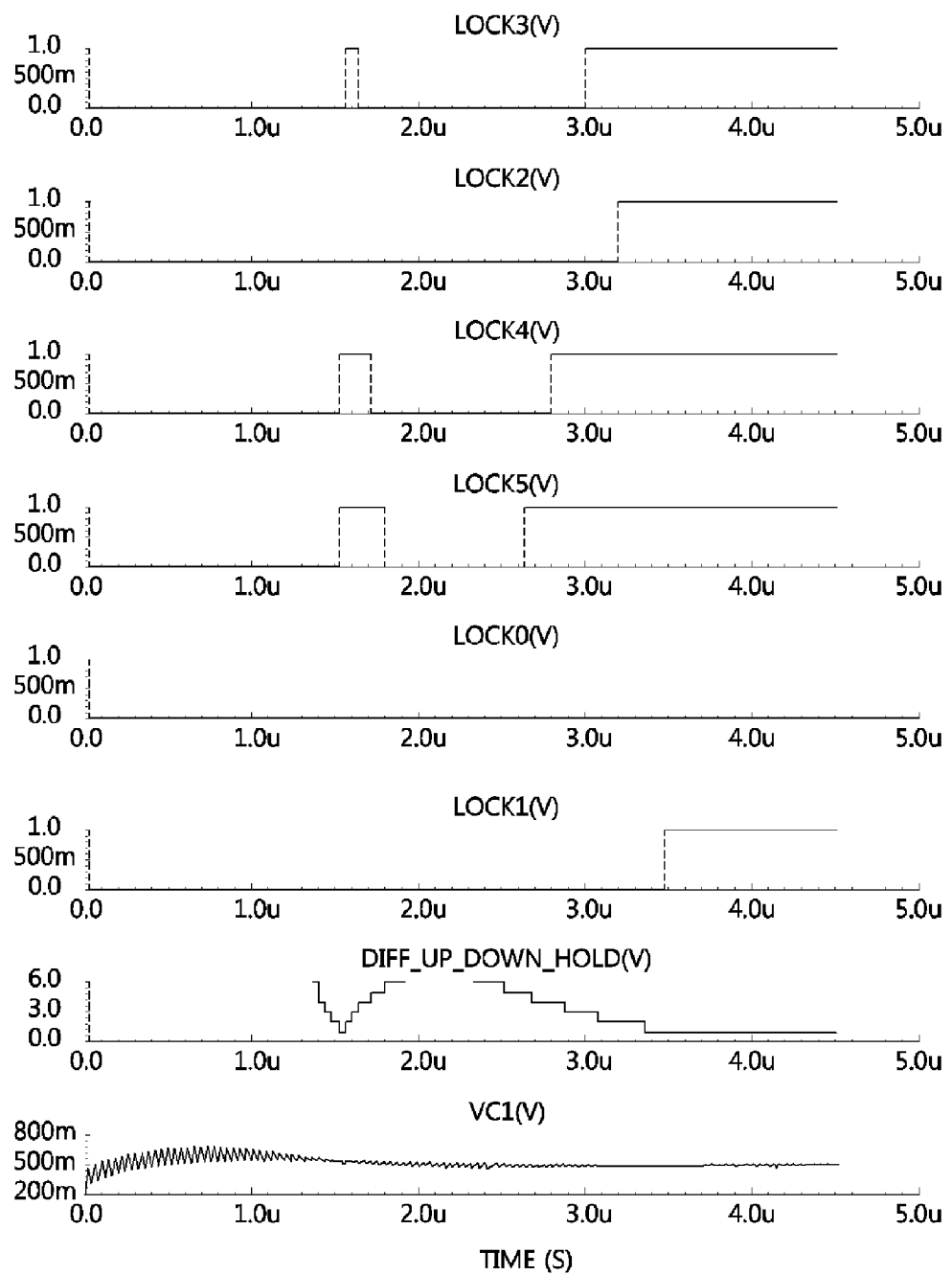
FIG. 8 is a timing diagram illustrating adjustment of precision of the lock detector according to an example embodiment of the present invention.

FIG. 8 is a timing diagram illustrating precision adjustment in the lock detector according to an example embodiment of the present invention.

In FIG. 8, "lock0" refers to a signal for determining whether lock is made when the last count value diff_up_down_hold, which is a signal obtained by sampling only the maximum value of the value obtained by performing counting using the clock signal vco1 which is the output of the voltage controlled oscillator 150, maintains a value equal to or less than 0, which is the comparison reference value N_set, during a certain section. Further, "lock1" refers to a signal for determining whether lock is made when the last count value diff_up_down_hold maintains a value equal to or less than 1 which is the comparison reference value N_set during a certain section. Further, "lock2" refers to a signal for determining whether lock is made when the last count value diff_up_down_hold maintains a value equal to or less than 2 which is the comparison reference value N_set during a certain section. Further, "lock3" refers to a signal for determining whether lock is made when the last count value diff_up_down_hold maintains a value equal to or less than 3 which is the comparison reference value N_set during a certain section. Further, "lock4" refers to a signal for determining whether lock is made when the last count value diff_up_down_hold maintains a value equal to or less than 4 which is the comparison reference value N_set during a certain section. Further, "lock5" refers to a signal for determining whether lock is made when the last count value diff_up_down_hold maintains a value equal to or less than 5 which is the comparison reference value N_set during a certain section.

In other words, malfunction may occur or a lock determination time may vary on the way according to a set value of the comparison reference value N_set.

Meanwhile, the certain section which is the activation section of the comparison reference value N_set may be set arbitrarily. In the timing diagram illustrated in FIG. 8, the certain section is set to 3 times the reference signal period Tref.

According to the respective signals lock0, lock1, lock2, lock3, lock4, and lock5, there is a case in which lock cannot be determined (lock0), a case in which lock is exactly determined (lock1 and lock2), and a case in which lock can be determined, which is, however, not exact (lock3, lock4, and lock5), as illustrated in FIG. 8.

When the lock cannot be detected with a desired specific comparison reference value N_set (e.g., lock0), some of the respective components of the phase-locked loop circuit 100 may not normally work.

For example, a ripple of the control voltage vc1 of the voltage controlled oscillator 150 necessary for the system is small, but a real ripple generated after the phase-locked loop is locked is greater. Accordingly, the lock cannot be determined with lock0.

Accordingly, the lock can be determined even with lock0 using a method of finely adjusting the operations of the components of the phase-locked loop circuit 100 using compensation signals and confirming the above-described signals lock0 to lock5 again in order to check which of the components of the phase-locked loop circuit 100 is problematic.

Figure 9:
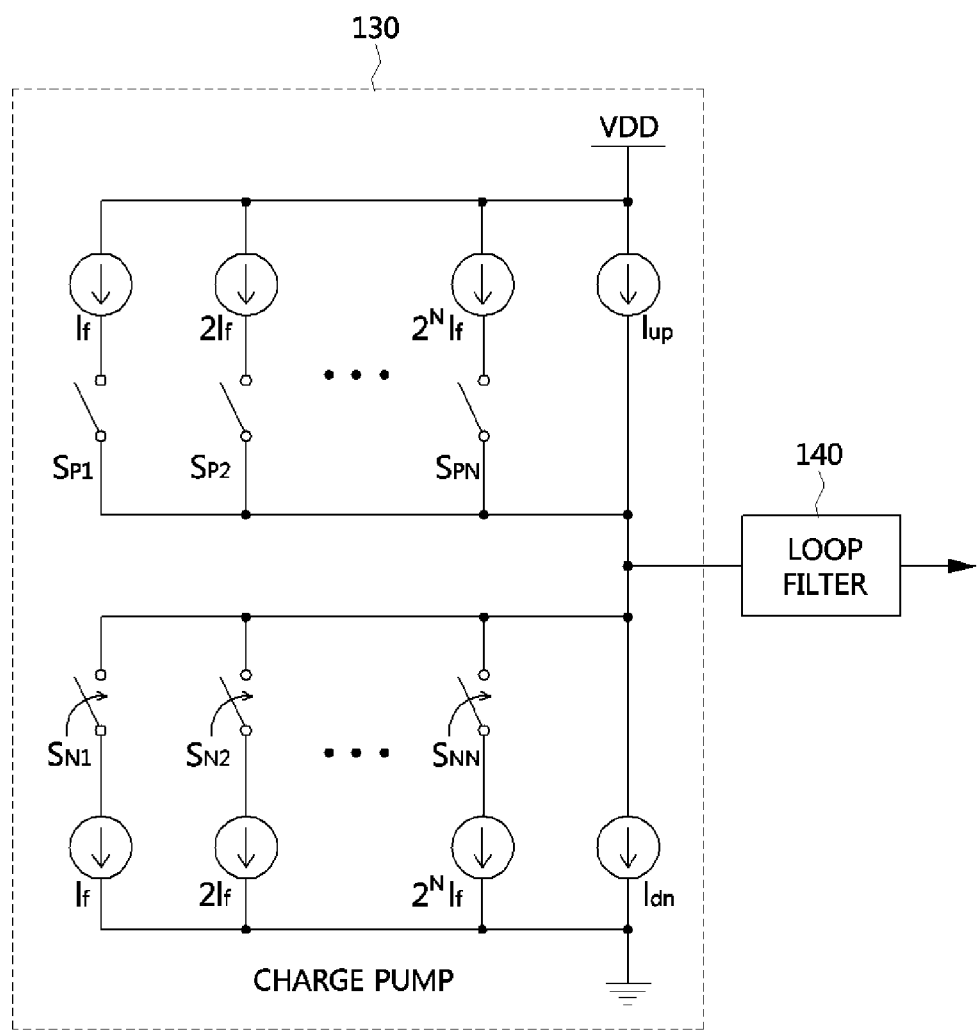
FIG. 9 is a circuit diagram illustrating lock detection through adjustment of an operation of a power pump.

FIG. 9 is a circuit diagram illustrating lock detection through adjustment of the operation of the charge pump.

Referring to FIG. 9, an operation of the charge pump 130 is finely adjusted based on the charge pump adjustment signal CS_CP provided from the lock detector 300.

Specifically, in a circuit of the charge pump 130, an upper current $I_{up}$ and a lower current $I_{dn}$, should exactly match in order to reduce the ripple of the control voltage vc1 of the voltage controlled oscillator 150 after the phase-locked loop enters a lock state.

In the circuit of the charge pump 130 illustrated in FIG. 8, current $I_f$ is relatively smaller than currents $I_{up}$ and $I_{dn}$, (e.g., about 1/10 to about 1/100), and increases in a multiple of 2. A flow of the current is controlled according to operation of switches $S_{P1}, S_{P2} \ldots S_{PN}, S_{N1}, S_{N1}, \ldots S_{NN}$ switched based on the charge pump compensation signal CS_CP.

In consideration of a case in which the upper current $I_{up}$ is higher than the lower current $I_{dn}$, in the circuit structure as described above, the lock detector adjusts the corresponding switches $S_{N1}, S_{N2}, \ldots, S_{NN}$ by a difference between the currents $I_{up}$ and $L_{dn}$, using the charge pump compensation signal CS_CP such that $I_{up}=I_{dn}+I_f+2I_f+, \ldots, +2^N I_f$. Accordingly, the ripple of vc1 is reduced and the lock detection signal can be generated even with lock0.

Here, the difference between the upper current $I_{up}$ and the lower current $I_{dn}$, may be initially determined based on the last count value diff_up_down_hold obtained in the lock state of the phase-locked loop circuit after all the switches are open. It may be determined which of the currents $I_{up}$ and $I_{dn}$ is smaller as follows. It may be determined that current of a corresponding current source is smaller, based on a signal first activated into 1 among the up signal and the down signal during one period of the phase-locked loop.

Accordingly, a digital bit value for each switch in the charge pump 130 may be determined so that the last count value diff_up_down_hold obtained when the phase-locked loop is locked while closing the switches of the current sources having smaller current one by one using the charge pump compensation signal CS_CP is minimized, and the determined digital bit value is provided to the charge pump 130, thereby detecting the lock state quickly and exactly.

Leakage current may flow in the loop filter 140 or a parameter value of the loop filter 140 may fluctuate due to a physical environment, a temperature, a voltage or the like, in addition to the change in current of the charge pump 130 described above. In order to compensate for such an abnormal operation of the loop filter 140, the lock detector 300 can provide the loop filter compensation signal CS_LF to the loop filter 140.

Further, the lock detector 300 may provide the voltage controlled oscillator compensation signal CS_VCO to the voltage controlled oscillator 150 and may provide the divider compensation signal CS_DIV to the divider 170 in order to compensate for a change in a gain or the like of the voltage controlled oscillator 150 and a change in a division ratio of the divider 170 due to the physical environment, the temperature, the voltage, or the like.

Further, the lock detector 300 may provide the phase frequency comparator compensation signal CS_PFD to the phase frequency comparator 120 in order to compensate for a change in a characteristic of the phase frequency comparator 120 due to the physical environment, the temperature, the voltage or the like.

FIG. 10 illustrates a compensation circuit of the voltage controlled oscillator according to an example embodiment of the present invention.

In FIG. 10(a), a case in which a variable current source (Ib_VCO) 1010 is connected between the voltage controlled oscillator 150 and a ground is illustrated, and in FIG. 10(b), an example of a case in which a variable current source 1010 is connected between a power supply voltage VDD and the voltage controlled oscillator 150 is illustrated. Further, FIG. 10(c) is a circuit diagram illustrating a detailed configuration of the variable current source 1010 illustrated in FIGS. 10(a) and 10(b).

As illustrated in FIG. 10(c), the variable current source 1010 may have a structure in which a bias current source $I_V$ and a plurality of current sources $I_V, 2I_V \ldots 2^N I_V$ are connected in parallel. The plurality of current sources $I_V, 2I_V \ldots 2^N I_V$ has a structure in which switches switched based on a plurality of switching control signals $S_{V1}$ to $S_{VN}$ constituting the voltage controlled oscillator compensation signal CS_VCO are connected in series.

In other words, the variable current source 1010 controls a flow of current provided from each of the current sources $I_V, 2I_V \ldots 2^N I_V$ based on the voltage controlled oscillator compensation signal CS_VCO provided from the lock detector 300 to adjust a bias current of the voltage controlled oscillator 150 and optimally set a bias current value of the voltage controlled oscillator 150.

FIG. 11 illustrates a compensation circuit of the phase frequency comparator according to an example embodiment of the present invention.

FIG. 11(a) is a circuit diagram illustrating a connection structure of a variable delay element 1110 and the phase frequency comparator 120, and FIG. 11(b) is a circuit diagram illustrating a detailed configuration of the variable delay element 1110.

In FIG. 11, $S_{PF1}$~$S_{PFN}$ refer to the phase frequency comparator compensation signal CS_PFD.

The variable delay element 1110 may be connected between an output of the AND gate 123 in the phase frequency comparator 120 and reset terminals of two D-flip flops 121, and sets an optimal delay value by delaying an output signal of the AND gate 123 in response to the phase frequency comparator compensation signal CS_PFD, $S_{PF1}$~$S_{PFN}$ as illustrated in FIG. 11.

Specifically, the variable delay element 1110 includes a plurality of delay cells 1111 having a fixed delay value and connected in series, and a multiplexer 1113 which receives respective outputs of the plurality of delay cells 1111, as inputs, and outputs a specific delayed signal among delayed signals provided by the plurality of delay cell 1111 based on the provided phase frequency comparator compensation signal $S_{PF1}$~$S_{PFN}$, as illustrated in FIG. 11(b).

FIG. 12 illustrates a loop filter compensation circuit according to an example embodiment of the present invention.

FIG. 12(a) illustrates an example of a circuit configuration of a third-order passive loop filter, FIG. 12(b) is a circuit diagram illustrating a concrete configuration of a variable resistor R2 illustrated in FIG. 12(a), and FIG. 12(c) is a circuit diagram illustrating a concrete configuration of a variable capacitor C2.

In FIG. 12, $S_{LC11}$~$S_{LC1N}$, $S_{LC21}$~$S_{LC2N}$, $S_{LC31}$~$S_{LC3N}$, $S_{LR21}$~$S_{LR2N}$, and $S_{LR31}$~$S_{LR3N}$ refer to the loop filter compensation signals CS_LF.

In an example embodiment of the present invention, the value of the loop filter can be optimally set by adjusting values of the respective resistors $R_2$ and $R_3$ and the respective capacitors $C_1$, $C_2$, and $C_3$ of the loop filter according to the filter compensation signal CS_LF provided from the lock detector 300, as illustrated in FIG. 12.

For example, as illustrated in FIG. 12(b), the variable resistor $R_2$ has a configuration in which a plurality of resistors $R_{2f}$, $2R_{2f}$, ..., $2^N R_{2f}$ are connected in series, and a switch switched based on the loop filter compensation signal CS_LF is connected to each resistor in parallel, such that a resistance value of the variable resistor $R_2$ can be adjusted through the loop filter compensation signal CS_LF.

Further, as illustrated in FIG. 12(c), the variable capacitor $C_2$ has a configuration in which a plurality of capacitors $C_{1f}$, $2C_{1f}$, ..., $2^N C_{1f}$ are connected in parallel, and a switch switched based on the loop filter compensation signal CS_LF is connected to each capacitor in series, such that a capacitance value of the variable capacitor $C_2$ can be adjusted through the loop filter compensation signal CS_LF.

FIG. 13 illustrates a divider compensation circuit according to an example embodiment of the present invention. An example of a prescaler circuit directly connected to the output signal of the voltage controlled oscillator 150 in the divider is illustrated.

In FIG. 13(a), a case in which a bias current source ($I_{b\_DIV}$) 1310 is connected between the divider 170 and a ground is illustrated, and in FIG. 13(b), an example of a case in which the bias current source 1310 is connected between a power supply voltage VDD and the divider 170 is illustrated. Further, FIG. 13(c) is a circuit diagram illustrating a detailed configuration of the bias current source 1310 illustrated in FIGS. 13(a) and 13(b).

In FIG. 13, $S_{D1}$~$S_{DN}$ refer to the divider compensation signal CS_DIV.

In the divider 170, a range of an operation frequency is adjusted according to a current value of the bias current source 1310. Specifically, as illustrated in FIG. 13(c), the bias current source 1310 has a configuration in which a bias current source $I_{div}$ and a plurality of current sources $I_{div}$, $2I_{div}$, ..., $2^N I_{div}$ are connected in parallel, and a switch controlled according to the divider compensation signals $S_{D1}$~$S_{DN}$ is connected to each of the plurality of current sources $I_{div}$, $2I_{div}$, ..., $2^N I_{div}$ in series.

In other words, in the bias current source 1310, a flow of current provided from each of the current sources $I_{div}$, $2I_{div}$, ..., $2^N I_{div}$ is controlled based on the divider compensation signal CS_DIV or $S_{D1}$~$S_{DN}$ provided from the lock detector 300 to adjust a bias current of the divider 170, thereby optimally setting a bias current value of the divider 170.

While the example embodiments of the present invention and their advantages have been described in detail, it should be understood that various changes, substitutions and alterations may be made herein without departing from the scope of the invention.

REFERENCE NUMERALS LIST

| | |
|---|---|
| 100: phase-locked loop circuit | 110: reference signal provider |
| 120: phase frequency comparator | 121: D-flip flop |
| 123: AND gate | 130: charge pump |
| 140: loop filter | 150: voltage controlled oscillator |
| 160: buffer | 170: divider |
| 300: lock detector | 310: counter unit |
| 311: EX-NOR gate | 312: first counter |
| 313: first DAC | 314: first delay unit |
| 315: first register | 316: second DAC |
| 330: lock detection unit | 331: comparator |
| 333: second delay unit | 333-1: delay element |
| 335: AND gate | 337: inverter |
| 339: second counter | 341: third DAC |
| 343: third delay unit | 345: second register |
| 347: fourth DAC | 349: multiplexer |
| 351: AND gate | 1010: variable current source |
| 1110: variable delay element | 1111: delay cell |
| 1113: multiplexer | 1310: bias current source |

What is claimed is:

1. A lock detector comprising:
   a counter unit which counts a non-matching section of a first signal and a second signal to provide a count value, the first signal and the second signal being comparison result signals obtained by comparing a phase of a reference signal with a phase of a comparison signal, wherein the counter unit includes:
      a first register that stores the count value in response to a delayed clock;
      a first gate which determines the non-matching section of the first signal and the second signal and outputs a determination result signal as a determination result; and
      a first counter which counts a clock signal when the determination result signal of the first gate indicates a non-matching state; and
   a lock detection unit which outputs a lock detection signal based on a result of comparing the count value with a reference value.

2. The lock detector according to claim 1, wherein the counter unit includes:
   a first delay unit which delays the determination result signal to output a delayed clock.

3. The lock detector according to claim 1, wherein:
   the counter unit is connected to a phase-locked loop and counts the non-matching section of the first signal and the second signal using a clock signal output from a voltage controlled oscillator of the phase-locked loop.

4. The lock detector according to claim 1, wherein the lock detection unit includes:
- a comparator which compares the count value with the reference value to output the comparison result signal;
- a second delay unit which includes a plurality of delay elements connected in series and outputs a delayed signal obtained by each delay element delaying a signal by a time set in advance;
- a second counter which counts a width of a first level indicating that the count value is smaller than the reference value using the reference signal to provide a width count value when the comparison result signal is the first level; and
- a second gate which outputs a last lock detection signal based on a delayed signal corresponding to the width count value among a plurality of delayed signals output from the second delay unit and the comparison result signal.

5. The lock detector according to claim 4, wherein the lock detection unit further includes:
- a third delay unit which delays the comparison result signal to output a delayed comparison result signal; and
- a second register which stores the width count value based on the delayed comparison result signal.

6. The lock detector according to claim 4, wherein the lock detection unit further includes a second gate which outputs a first lock detection signal based on the comparison result signal and a delayed signal having a shortest delay time among the plurality of delayed signals output from the second delay unit.

7. The lock detector according to claim 1, wherein the reference value is provided from the outside of the lock detector, and a size and a duration of the reference value are adjustable.

8. The lock detector according to claim 1, wherein the lock detector provides a compensation signal for compensating for an operational property of a circuit to which the lock detector is connected.

9. A clock generator comprising:
- a phase-locked loop circuit which compares a comparison signal obtained by dividing a generated clock signal with a reference signal, and adjusts a frequency of the clock signal based on a comparison result to fix the clock signal to a frequency set in advance; and
- a lock detector which is connected to the phase-locked loop circuit, counts a non-matching section of a first signal and a second signal to generate a count value, the first signal and the second signal being comparison result signals obtained by comparing a phase of the reference signal with a phase of the comparison signal, and then outputs a lock detection signal based on a result of comparing the count value with a reference value, wherein the lock detector:
  - determines the non-matching section of the first signal and the second signal and outputs a determination result signal as a determination result; and
  - a first counter which counts a clock signal when the determination result signal of a first gate indicates a non-matching state;
  - a first register that stores the count value in response to a delayed clock.

10. The clock generator according to claim 9, wherein:
the phase-locked loop circuit includes a charge pump which generates a current signal corresponding to a result of comparing the comparison signal with the reference signal, and
the lock detector provides the charge pump with a compensation signal for compensating for a current property of the charge pump.

11. The clock generator according to claim 9, wherein the phase-locked loop circuit includes a voltage controlled oscillator that generates the clock signal.

* * * * *